(12) United States Patent
Hatano et al.

(10) Patent No.: US 8,007,962 B2
(45) Date of Patent: Aug. 30, 2011

(54) PHOTOMASK

(75) Inventors: Keisuke Hatano, Kanagawa (JP);
Takeshi Matsunuma, Kumamoto (JP);
Shinji Miyazawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 18 days.

(21) Appl. No.: 12/585,922

(22) Filed: Sep. 29, 2009

(65) Prior Publication Data

US 2010/0124710 A1    May 20, 2010

(30) Foreign Application Priority Data

Nov. 18, 2008   (JP) .................................. 2008-294877

(51) Int. Cl.
*G03F 1/00*    (2006.01)
*G03F 1/08*    (2006.01)
(52) U.S. Cl. .......................................................... 430/5
(58) Field of Classification Search ........................ 430/5
See application file for complete search history.

(56) References Cited

U.S. PATENT DOCUMENTS

| 7,419,748 | B1 * | 9/2008 | Ahn ................................... 430/5 |
| 2007/0057349 | A1 * | 3/2007 | Yang .................................. 430/5 |
| 2010/0112462 | A1 * | 5/2010 | Rolfson ........................... 430/5 |

FOREIGN PATENT DOCUMENTS

| JP | 03-121456 | 5/1991 |
| JP | 05-019448 | 1/1993 |

* cited by examiner

*Primary Examiner* — Mark F Huff
*Assistant Examiner* — John Ruggles
(74) *Attorney, Agent, or Firm* — Rader, Fishman & Grauer PLLC

(57) ABSTRACT

A photomask includes a base, a plurality of chip pattern regions over which a light shielding pattern of a metal material is defined, the plurality of chip pattern regions being defined on the base, scribe regions defined between the chip pattern regions, the scribe regions being defined by using the light shielding pattern, and slits in which the light shielding pattern is not defined, the slits being defined so as to surround the chip pattern regions.

7 Claims, 4 Drawing Sheets

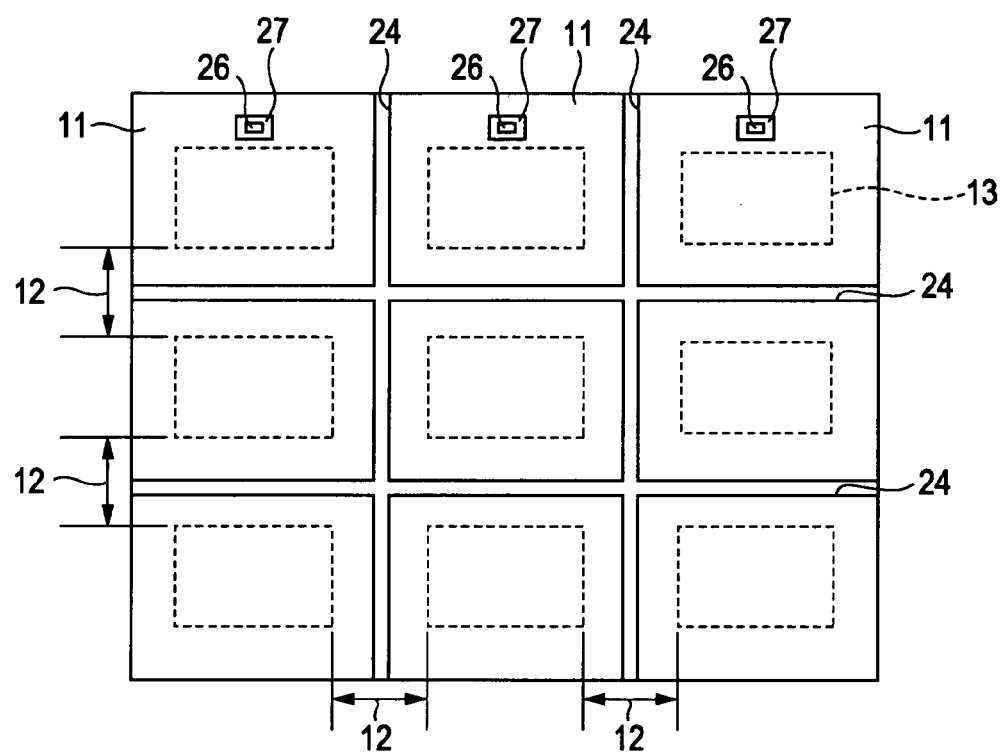
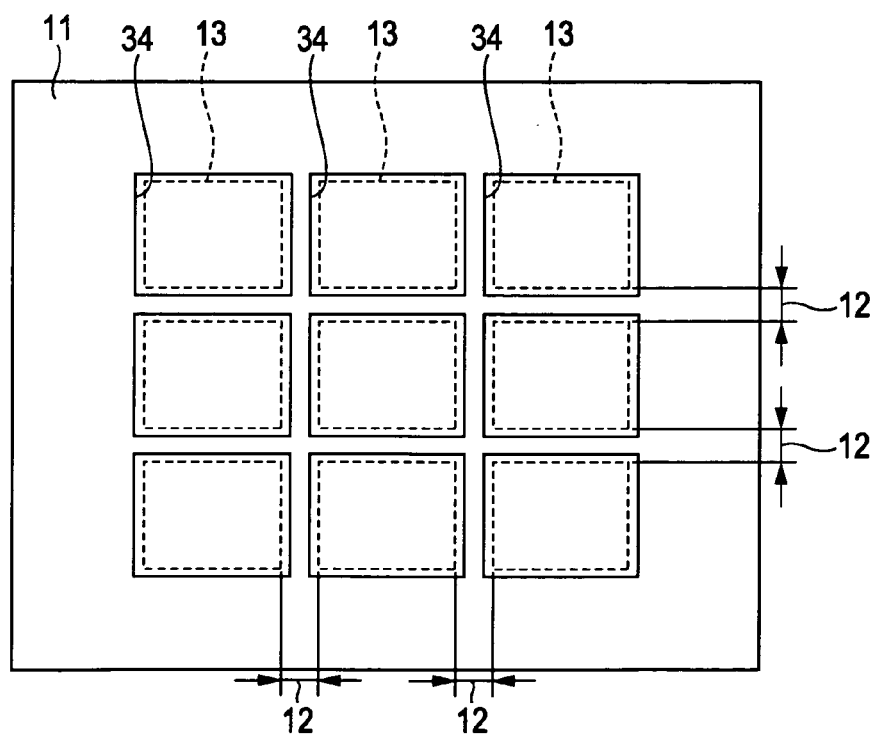

PHOTOMASK

BACKGROUND OF THE INVENTION

1. Field of the Invention

The present invention relates to a photomask of an exposure device, having a light shielding pattern, which is used in a photolithographic process for use in the fabrication of semiconductor devices.

2. Description of the Related Art

In a photolithographic process for fabricating semiconductor devices or the like, multichip photomasks are used. In a photomask, a layout such as an arrangement of elements or a circuit pattern of semiconductor devices is defined by using a light shielding pattern of metal or the like (see, for example, Japanese Unexamined Patent Application Publication Nos. 3-121456 and 5-19448).

FIG. 5 shows a schematic configuration of a multichip photomask 50 for fabricating semiconductor devices.

The photomask 50 shown in FIG. 5 has a light shielding pattern 51 of metal such as chromium (Cr) in accordance with a layout of semiconductor devices to be formed. The light shielding pattern 51 is defined on substantially an entire surface of the photomask 50.

A plurality of chip pattern regions 53, which are indicated by broken lines, are also defined on the photomask 50. Further, scribe regions 52 for separating the chip pattern regions 53 from one another are defined between the chip pattern regions 53.

The light shielding pattern 51 is defined over the chip pattern regions 53 in accordance with a layout such as an arrangement of elements or a circuit pattern of semiconductor devices to be formed using the photomask 50.

FIG. 6 shows an enlarged view of one of the chip pattern regions 53 in the photomask 50. In the chip pattern region 53, for example, in order to form an independent island-shaped layout on a semiconductor device or the like, an island-shaped isolated light shielding pattern 55 is defined so as to be surrounded by a light transmitting pattern 57 in accordance with the layout of the semiconductor device or the like.

SUMMARY OF THE INVENTION

When the photomask 50 shown in FIG. 5 with the light shielding pattern 51 defined on substantially the entire surface thereof is mounted in an exposure device, due to the static electricity discharged from a person who handles the photomask 50 or friction occurring in the exposure device, the metal material of the light shielding pattern 51 is charged.

Also in the chip pattern region 53 shown in FIG. 6, the island-shaped isolated light shielding pattern 55 and the light shielding pattern 51 defined around the island-shaped isolated light shielding pattern 55 are individually charged. However, since the difference in area between the isolated light shielding pattern 55 and the adjacent light shielding pattern 51 defined therearound is large, the isolated light shielding pattern 55 and the light shielding pattern 51 show different amounts of charge due to the difference in area. Thus, the potential difference between the isolated light shielding pattern 55 and the light shielding pattern 51 increases. The difference between the amounts of charge increases depending on the difference in area between the patterns. When the potential difference between the isolated light shielding pattern 55 and the light shielding pattern 51 increases and exceeds a certain threshold value, discharge occurs between the patterns. Heat generated by the discharge melts the metal material to cause, as shown in FIG. 7, a short-circuit portion 56 in the light transmitting pattern 57 between the light shielding pattern 51 and the isolated light shielding pattern 55.

As described above, in the photomask 50 shown in FIG. 5, electrostatic damage of the isolated light shielding patterns 55 occurs.

The short-circuit portions 56 in the isolated light shielding patterns 55, which are caused by the electrostatic damage, cause deformation of the predetermined shape of the light shielding pattern 51 defined in the photomask 50. Exposure using a photomask in which electrostatic damage has occurred may impair the formation of a predetermined pattern in the fabrication of semiconductor devices or the like.

It is therefore desirable to provide a photomask having an island-shaped independent light shielding pattern, in which the deformation of the pattern due to electrostatic damage can be prevented or reduced.

According to an embodiment of the present invention, a photomask includes a base (transparent substrate), a plurality of chip pattern regions over which a light shielding pattern of a metal material is defined, the plurality of chip pattern regions being defined on the base, and scribe regions defined between the chip pattern regions, the scribe regions being defined by using the light shielding pattern. The photomask also includes slits in which the light shielding pattern is not defined, the slits being defined so as to surround the chip pattern regions.

In a photomask according to an embodiment of the present invention, a slit which is a region with no metal pattern is defined around a chip pattern region. Thus, a plurality of chip pattern regions defined on a base are separated from one another by slits. Therefore, for example, even when an island-shaped isolated light shielding pattern is defined in a chip pattern region, the difference can be reduced between an area of the isolated light shielding pattern and an area of a light shielding pattern defined around the isolated light shielding pattern can be reduced.

The reduction in the difference between the isolated light shielding pattern and the pattern defined therearound can reduce the potential difference between the patterns even when the metal material of the light shielding pattern is charged due to static electricity or the like.

According to an embodiment of the present invention, therefore, a photomask in which even when an island-shaped isolated light shielding pattern is defined, the deformation of the pattern due to the electrostatic damage caused between the island-shaped isolated light shielding pattern and a light shielding pattern defined therearound can be prevented or reduced can be achieved.

BRIEF DESCRIPTION OF THE DRAWINGS

FIG. 2 is a schematic configuration diagram of a photomask according to a second embodiment of the present invention;

FIG. 3 is a schematic configuration diagram of a photomask according to a third embodiment of the present invention;

DESCRIPTION OF THE PREFERRED EMBODIMENTS

Embodiments of the present invention will be described hereinafter. Note that the following embodiments of the present invention are not intended in an exclusive or limited sense.

First Embodiment

A photomask according to a first embodiment of the present invention will now be described.

Figure 1A:
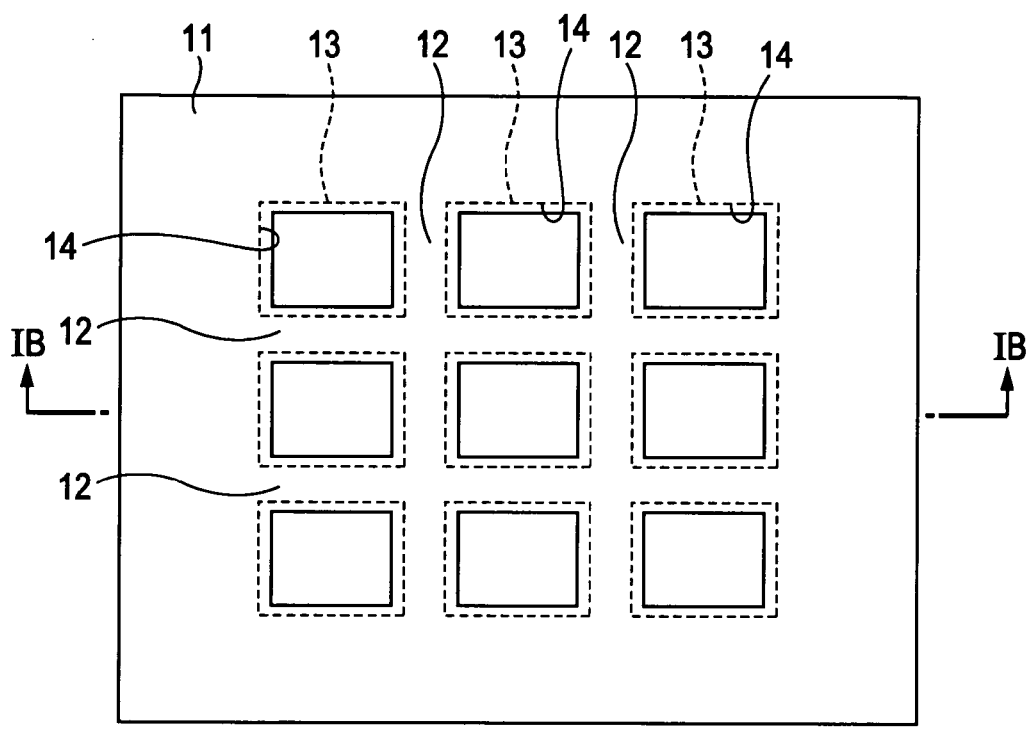
FIG. 1A is a schematic configuration diagram of a photomask according to a first embodiment of the present invention.
Figure 1B:
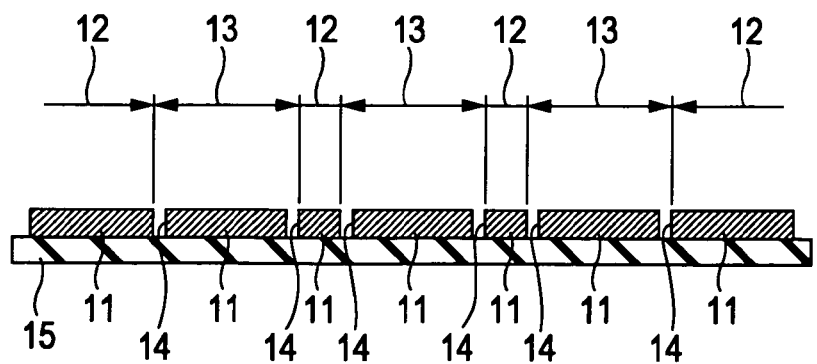
FIG. 1B is a cross-sectional view of the photomask, taken along the line IB-IB of FIG. 1A.

FIG. 1A is a schematic configuration diagram of a photomask 10 according to the first embodiment. FIG. 1B is a cross-sectional view taken along the line IB-IB of FIG. 1A.

The photomask 10 shown in FIG. 1A may be a multichip photomask (or multi-layer photomask or multi-product photomask) for fabricating semiconductor devices.

The photomask 10 has a light shielding pattern 11 defined on substantially an entire surface thereof. The light shielding pattern 11 may be composed of a metal material such as chromium, molybdenum, tungsten, aluminum, or nickel. The photomask 10 also includes a plurality of chip pattern regions 13 in accordance with a layout of semiconductor devices on a base (transparent substrate) (hereinafter referred to simply as a "base"). In FIG. 1A, the chip pattern regions 13 are indicated by broken lines. The light shielding pattern 11 is defined over the chip pattern regions 13 in accordance with a layout such as an arrangement of elements or a circuit pattern of semiconductor devices to be formed using the photomask 10.

Further, scribe regions 12 for separating the chip pattern regions 13 from one another are defined between the chip pattern regions 13 by using the light shielding pattern 11. The scribe regions 12 are defined on the photomask 10 along scribe lines which are regions for dicing a plurality of semiconductor devices to be formed on the base in the form of chips.

Further, the photomask 10 is configured such that, as shown in FIG. 1B, the light shielding pattern 11 of a metal material such as chromium is defined on a base 15. The base 15 may be composed of an insulating material transmitted through a specific wavelength of an exposure device used for fabricating semiconductor devices or the like, such as quartz or low-expansion glass.

On the base 15, the plurality of chip pattern regions 13 and the scribe regions 12 defined between the chip pattern regions 13 are defined by using the light shielding pattern 11.

The photomask 10 shown in FIGS. 1A and 1B has slits 14 in portions adjacent to the scribe regions 12 in the chip pattern regions 13 indicated by broken lines in FIG. 1A. The slits 14 are regions where the light shielding pattern 11 is not formed.

The slits 14 are formed so as to surround the chip pattern regions 13. The slits 14 allow portions where the light shielding pattern 11 is formed in the adjacent chip pattern regions 13 to be electrically separated from each other on the photomask 10.

The slits 14 have a width of about 0.5 μm and are defined continuously.

The slits 14 are disposed in portions within the chip pattern regions 13 where the light shielding pattern 11 is not formed in accordance with a layout such as a circuit pattern of semiconductor devices. In other words, the slits 14 are used in order to avoid a light shielding pattern for forming a layout such as a circuit pattern of semiconductor devices from being formed around the periphery of the chip pattern regions 13.

The photomask 10 described above is produced using the following method by way of example.

First, a metal layer of chromium or the like, which serves as a light shielding pattern, is formed on an entire surface of a base of quartz or the like. A photoresist layer is further formed on the metal layer.

Next, the photoresist layer is exposed to light and is developed to form a photoresist pattern which is a reverse pattern of a light shielding pattern to be formed on a photomask. Then, the underlying metal layer is etched using the formed photoresist pattern as a mask.

With the above method, a photomask having a predetermined light shielding pattern can be produced.

The formation of the slits 14 allows the chip pattern regions 13 to be separated from the light shielding pattern 11 defined in the portion other than the chip pattern regions 13 in the photomask 10. Therefore, for example, even when an island-shaped isolated light shielding pattern is defined in the chip pattern regions 13, the difference can be reduced between an area of the isolated light shielding pattern and an area of a light shielding pattern in the chip pattern regions 13, which is defined around the isolated light shielding pattern. In addition, even if the metal material of the light shielding pattern 11 of the photomask 10 is charged, the difference in the amount of charge between the isolated light shielding pattern and the light shielding pattern defined around the isolated light shielding pattern can be reduced, thereby reducing the potential difference therebetween. This can prevent discharge from occurring between the isolated light shielding pattern and the light shielding pattern defined around the isolated light shielding pattern.

According to the above configuration, therefore, a photomask having a light shielding pattern in which the generation of a short-circuit portion between a light shielding pattern and an isolated light shielding pattern can be prevented or reduced so that the occurrence of electrostatic damage can be prevented or reduced can be achieved.

In the photomask 10 shown in FIG. 1A, the slits 14 are defined in the chip pattern regions 13. In general, an island-shaped isolated light shielding pattern that is susceptible to electrostatic damage and that is likely to cause a short circuit is often defined in the chip pattern regions 13.

Further, since the slits 14 are defined in the chip pattern regions 13, the area of the portions within the chip pattern regions 13 where the light shielding pattern 11 is formed can be reduced as compared with the configuration in which slits are defined outside the chip pattern regions 13, for example, in the scribe regions 12. Therefore, the difference can be reduced between an area of an isolated light shielding pattern defined within the chip pattern regions 13 and an area of a light shielding pattern defined around the isolated light shielding pattern.

Accordingly, the formation of the slits 14 in the chip pattern regions 13 can further reduce the difference between an isolated light shielding pattern and a light shielding pattern defined around the isolated light shielding pattern. Thus, the occurrence of electrostatic damage in the isolated light shielding pattern can be prevented or reduced.

Therefore, when an island-shaped isolated light shielding pattern is defined in a chip pattern region, the formation of a slit in the chip pattern region can reduce the area of a light shielding pattern within the chip pattern region. The occurrence of electrostatic damage can be effectively prevented or reduced.

Second Embodiment

FIG. 2 is a schematic configuration diagram of a photomask 20 according to a second embodiment of the present invention. In FIG. 2, components similar to those of the photomask 10 shown in FIGS. 1A and 1B are assigned the same reference numerals, and detailed descriptions thereof are omitted.

Like the photomask 10 shown in FIG. 1A, the photomask 20 shown in FIG. 2 may be a multichip photomask (or multi-layer photomask or multi-product photomask) for fabricating semiconductor devices.

The photomask 20 has a light shielding pattern 11 of metal such as chromium defined on substantially an entire surface thereof. The photomask 20 also includes a plurality of chip pattern regions 13 in accordance with a layout of semiconductor devices on a base. In FIG. 2, the chip pattern regions 13 are indicated by broken lines. The light shielding pattern 11 is defined over the chip pattern regions 13 in accordance with a layout such as an arrangement of elements or a circuit pattern of semiconductor devices to be formed using the photomask 20.

In the photomask 20, scribe regions 12 for separating the chip pattern regions 13 from one another are defined between the chip pattern regions 13 by using the light shielding pattern 11. The scribe regions 12 have slits 24 defined at the center thereof for separating the light shielding pattern 11 in the photomask 20 into portions corresponding to the chip pattern regions 13. The slits 24 have a width of about 0.5 μm and are defined continuously.

In the photomask 20, island-shaped isolated light shielding patterns 26 are further defined at different positions from those of the slits 24 defined in the scribe regions 12 in such a manner that the island-shaped isolated light shielding patterns 26 are surrounded by light transmitting patterns 27.

Like the photomask 20 shown in FIG. 2, in a case where the island-shaped isolated light shielding patterns 26 are defined in the scribe regions 12 surrounding the chip pattern regions 13, it is necessary to reduce the difference between the isolated light shielding patterns 26 and the light shielding pattern 11 defined around the isolated light shielding patterns 26. In this case, the formation of slits in the chip pattern regions 13 so as to be adjacent to the scribe regions 12 in a manner similar to that of the slits 14 in the photomask 10 shown in FIG. 1 would not help reduce the difference between the light shielding pattern 11 and the isolated light shielding patterns 26. Thus, electrostatic damage of the isolated light shielding patterns 26 is likely to occur.

Therefore, as shown in FIG. 2, the slits 24 are continuously defined around the center of the scribe regions 12 so that the plurality of chip pattern regions 13 defined in the photomask 20, together with the island-shaped isolated light shielding patterns 26 defined around the chip pattern regions 13, can be separated from one another.

The above configuration of the slits 24 defined in the photomask 20 can reduce the difference between the isolated light shielding patterns 26 and the light shielding pattern 11 defined around the isolated light shielding patterns 26.

Thus, even if the metal material of the light shielding pattern 11 of the photomask 10 is charged, the difference in the amount of charge between the isolated light shielding patterns 26 and the light shielding patterns defined around the isolated light shielding patterns 26 can be reduced. In addition, the potential difference therebetween is reduced, thereby preventing or reducing the occurrence of discharge between the isolated light shielding patterns 26 and the light shielding patterns defined around the isolated light shielding patterns 26. The prevention or reduction of discharge may therefore lead to preventing or reducing the occurrence of electrostatic damage of the isolated light shielding patterns 26.

Furthermore, the chip pattern regions 13 are separated from the light shielding pattern 11 defined therearound by the slits 24. Thus, for example, when an island-shaped isolated light shielding pattern is defined in the chip pattern regions 13, the difference can also be reduced between an area of the isolated light shielding pattern in the chip pattern regions 13 and an area of a light shielding pattern in the chip pattern regions 13, which is defined around the isolated light shielding pattern.

Therefore, even if the metal material of the light shielding pattern 11 of the photomask 20 is charged, the difference in the amount of charge between the isolated light shielding pattern in the chip pattern regions 13 and the light shielding pattern defined around the isolated light shielding pattern can be reduced. In addition, the potential difference therebetween is reduced, thereby preventing discharge from occurring between the isolated light shielding pattern and the light shielding pattern defined around the isolated light shielding pattern. Therefore, the occurrence of electrostatic damage of the isolated light shielding pattern in the chip pattern regions 13 can be prevented or reduced.

In the photomask 20 shown in FIG. 2, the slits 24 are defined in the scribe regions 12, and are thus defined at different positions from those in the chip pattern regions 13. This can reduce the effect of position misalignment in a photomask or the like in the exposure process on the image formation on semiconductor devices or the like, as compared with the photomask 10 shown in FIG. 1A in which slits are defined in chip patterns.

In the exposure process for fabricating semiconductor devices or the like, position misalignment in a photomask may have great effect on the arrangement of elements or circuit pattern of semiconductor devices when slits are defined in the chip pattern regions 13. Since a layout such as an arrangement of elements or a circuit pattern of semiconductor devices is defined in chip pattern regions by using a light shielding pattern, due to position misalignment in a photomask, slits may have effect on a layout such as a circuit pattern of semiconductor devices. Therefore, the formation of the slits 24 in the scribe regions 12 can reduce the effect of position misalignment in a photomask on the image formation on semiconductor devices.

Third Embodiment

FIG. 3 is a schematic configuration diagram of a photomask 30 according to a third embodiment of the present invention. In FIG. 3, components similar to those of the photomask 10 shown in FIGS. 1A and 1B are assigned the same reference numerals, and detailed descriptions thereof are omitted.

Like the photomask 10 shown in FIG. 1A, the photomask 30 shown in FIG. 3 may be a multichip photomask (or multi-layer photomask or multi-product photomask) for fabricating semiconductor devices.

The photomask 30 has a light shielding pattern 11 of metal such as chromium defined on substantially an entire surface thereof. The photomask 30 also includes a plurality of chip pattern regions 13 in accordance with a layout of semiconductor devices on a base. In FIG. 3, the chip pattern regions 13 are indicated by broken lines. The light shielding pattern 11 is defined over the chip pattern regions 13 in accordance with a layout such as an arrangement of elements or a circuit pattern of semiconductor devices to be formed using the photomask 30.

In the photomask 30, scribe regions 12 for separating the chip pattern regions 13 from one another are further defined between the chip pattern regions 13 by using the light shielding pattern 11.

In the photomask 30, further, slits 34 for separating the chip pattern regions 13 from other light shielding patterns are defined in the scribe regions 12 adjacent to the chip pattern regions 13. The slits 34 have a width of about 0.5 µm, and are continuously defined so as to surround the chip pattern regions 13.

The configuration of the photomask 30 can achieve advantages similar to those achieved by the configuration of the photomask 10 shown in FIG. 1A and FIG. 1B. Specifically, the formation of the slits 34 allows the chip pattern regions 13 to be separated from the light shielding pattern 11 defined in the portion other than the chip pattern regions 13 on the photomask 30. Therefore, for example, even when an island-shaped isolated light shielding pattern is defined in the chip pattern regions 13, the difference can be reduced between an area of the isolated light shielding pattern and an area of a light shielding pattern in the chip pattern regions 13, which is defined around the isolated light shielding pattern. In addition, even if the metal material of the light shielding pattern 11 in the photomask 30 is charged, the difference in the amount of charge between the isolated light shielding pattern and the light shielding pattern defined around the isolated light shielding pattern can be reduced, thereby reducing the potential difference therebetween. This can prevent discharge from occurring between the isolated light shielding pattern and the light shielding pattern defined around the isolated light shielding pattern.

The photomask 30 shown in FIG. 3 can be applied in a case where it is difficult to form the slits 24 shown in FIG. 2 around the center of the scribe regions 12, for example, in order to form a predetermined light shielding pattern such as an alignment mark or a light transmitting pattern in the scribe regions 12. The photomask 30 can also be applied in a case where light shielding patterns are defined at the edge of the chip pattern regions 13 in accordance with a circuit pattern of semiconductor devices or the like.

As shown in FIG. 3, the formation of the slits 34 in alignment regions defined in the scribe regions 12 adjacent to the chip pattern regions 13 ensures that the chip pattern regions 13 can be separated from one another. Furthermore, a region including the chip pattern regions 13 separated by the slits 34 is smaller than that in the photomask 20 shown in FIG. 2. Thus, the difference can be reduced between an area of the island-shaped isolated light shielding pattern regions defined in the chip pattern regions 13 and an area of the light shielding pattern 11 defined therearound. Therefore, the occurrence of electrostatic damage of the island-shaped isolated light shielding pattern regions can be prevented or reduced. Furthermore, since the positions where the slits 34 are defined in the scribe regions 12 are located at the edge of the scribe regions 12, design flexibility in forming the predetermined light shielding pattern 11, such as an alignment mark, in the scribe regions 12 can be improved.

Fourth Embodiment

Figure 4:
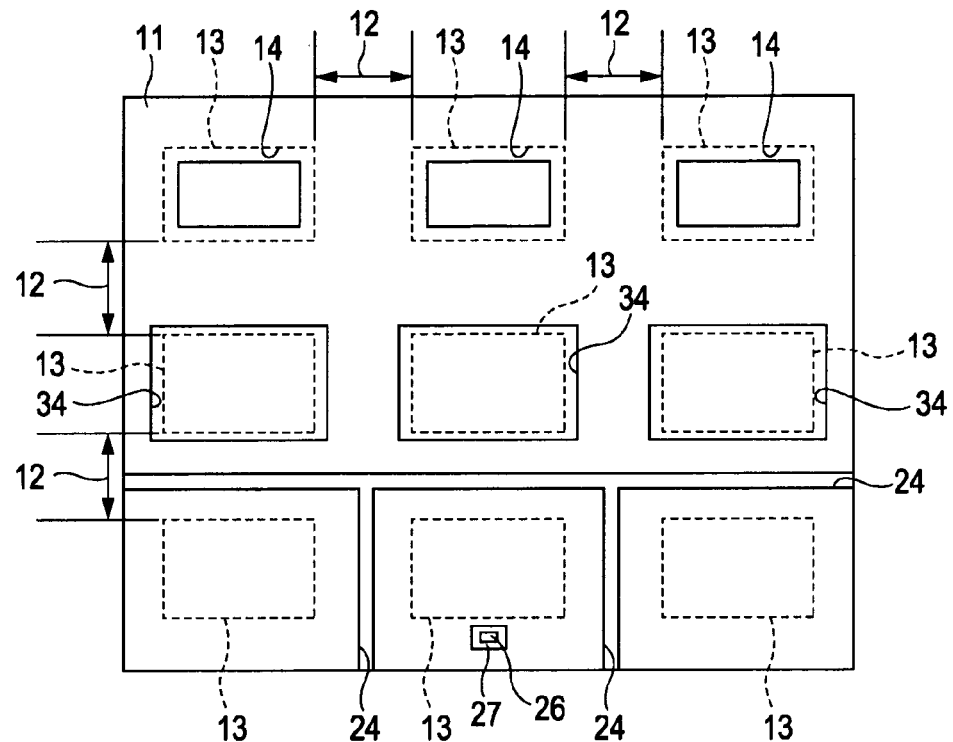
FIG. 4 is a schematic configuration diagram of a photomask according to a fourth embodiment of the present invention.
Figure 5:
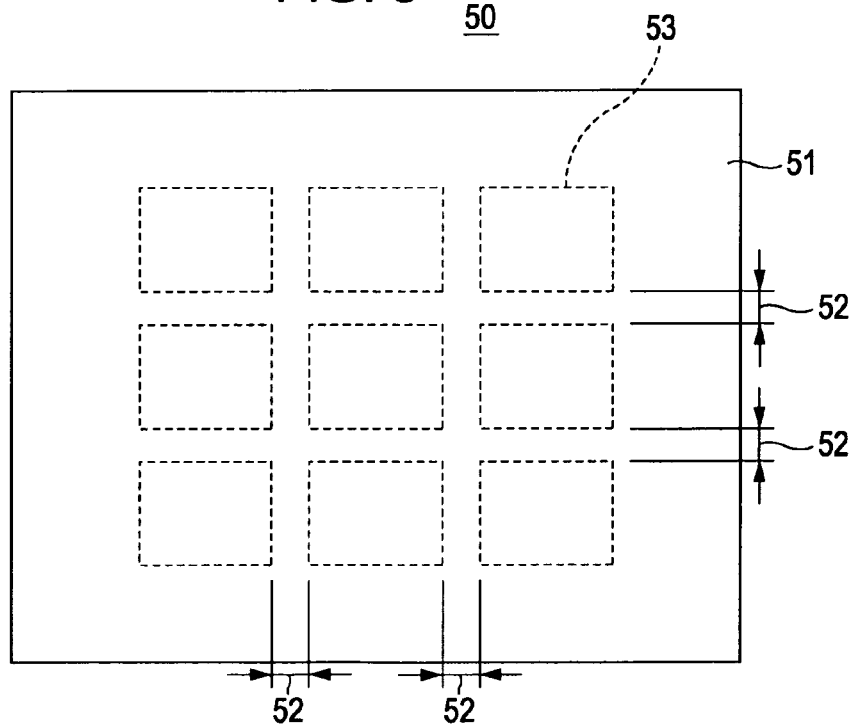
FIG. 5 is a schematic configuration diagram of a photomask of the related art.
Figure 6:
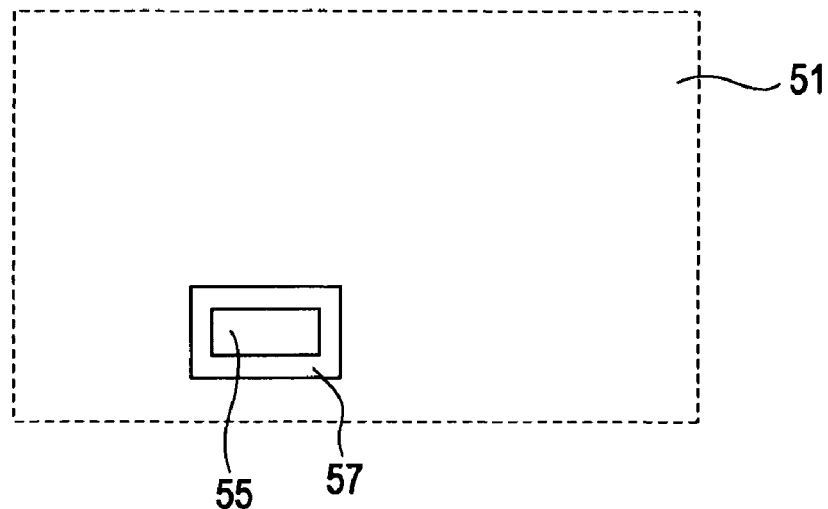
FIG. 6 is an enlarged view of a chip pattern region in the photomask of the related art.
Figure 7:
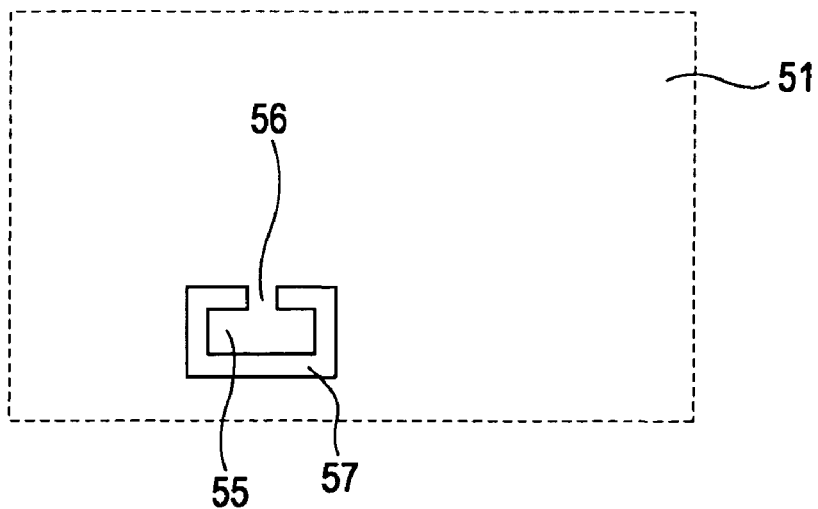
FIG. 7 is an enlarged view of a chip pattern region where electrostatic damage has occurred in the photomask of the related art.

FIG. 4 is a schematic configuration diagram of a photomask 40 according to a fourth embodiment of the present invention. In FIG. 4, components similar to those of the photomasks 10, 20, and 30 shown in FIGS. 1A, 1B, 2 and 3 are assigned the same reference numerals, and detailed descriptions thereof are omitted.

Like the photomask 10 shown in FIG. 1A, the photomask 40 shown in FIG. 4 may be a multichip photomask (or multilayer photomask or multi-product photomask) for fabricating semiconductor devices.

The photomask 40 has a light shielding pattern 11 of metal such as chromium defined on substantially an entire surface thereof. The photomask 40 also includes a plurality of chip pattern regions 13 in accordance with a layout of semiconductor devices on a base. In FIG. 4, the chip pattern regions 13 are indicated by broken lines. The light shielding pattern 11 is defined over the chip pattern regions 13 in accordance with a layout such as an arrangement of elements or a circuit pattern of semiconductor devices to be formed using the photomask 40. In the photomask 40, scribe regions 12 for separating the chip pattern regions 13 from one another are further defined between the chip pattern regions 13 by using the light shielding pattern 11.

In the photomask 40, further, slits 14, 24, and 34 for separating the chip pattern regions 13 from other light shielding patterns are defined in accordance with the chip pattern region design, the scribe region pattern design, or the like. The slits 14, 24, and 34 shown in FIG. 4 may be formed by combining the configurations of the slits 14, 24, and 34 defined in the photomasks 10, 20, and 30 shown in FIGS. 1A, 1B, 2, and 3.

As shown in FIG. 4, the photomask 40 may be configured by combining the configurations of the slits 14, 24, and 34 in the photomasks 10, 20, and 30 shown in FIGS. 1A, 1B, 2, and 3. The above configuration can achieve advantages similar to those achieved by the photomasks 10, 20, and 30 shown in FIGS. 1A, 1B, 2, and 3. Specifically, the formation of the slits 14, 24, and 34 allows the chip pattern regions 13 to be separated from the light shielding pattern 11 defined in the portion other than the chip pattern regions 13 in the photomask 40.

Therefore, for example, even when an island-shaped isolated light shielding pattern is defined in the chip pattern regions 13, the difference can be reduced between an area of the isolated light shielding pattern and an area of a light shielding pattern in the chip pattern regions 13, which is defined around the isolated light shielding pattern. In addition, even if the metal material of the light shielding pattern 11 in the photomask 40 is charged, the difference in the amount of charge between the isolated light shielding pattern and the light shielding pattern defined around the isolated light shielding pattern can be reduced, thereby reducing the potential difference therebetween. This can prevent discharge from occurring between the isolated light shielding pattern and the light shielding pattern defined around the isolated light shielding pattern.

According to the configuration shown in FIG. 4, therefore, a photomask having a light shielding pattern in which the generation of a short-circuit portion between a light shielding pattern and an isolated light shielding pattern can be prevented or reduced so that the occurrence of electrostatic damage can be prevented or reduced can be achieved.

Furthermore, even a photomask configured such that chip pattern regions of different shapes are defined in a single pattern mask or an island-shaped isolated light shielding pattern 26 is defined in part of the scribe regions 12 can also be supported by combining the slits 14, 24, and 34.

In the foregoing embodiments, photomasks and chip pattern regions are illustrated by rectangles. However, the shapes thereof are not limited to rectangles. The shapes of the individual components of a photomask according to an embodiment of the present invention can be changed in accordance with the shape or the like of semiconductor devices to be fabricated using the photomask.

In the foregoing embodiments, furthermore, three vertical and three horizontal chip pattern regions, i.e., a total of nine chip pattern regions, are defined in a photomask. However, the arrangement and number of chip pattern regions to be defined in a photomask are not limited thereto. That is, the arrangement and number of chip pattern regions to be defined in a photomask can be changed as desired. Also in this case, slits for separating chip pattern regions from one another are defined so as to surround the individual chip pattern regions, thereby preventing the deformation of a light shielding pattern due to electrostatic damage.

The present invention is not limited to the configurations described above in the foregoing embodiments, and a variety of modifications and changes can be made without departing from the scope of the present invention.

The present application contains subject matter related to that disclosed in Japanese Priority Patent Application JP 2008-294877 filed in the Japan Patent Office on Nov. 18, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photomask comprising:
a base having a first surface and an opposite second surface and fabricated from an electrically non-conductive material;
a light shielding pattern fabricated from metal material and disposed on and adhering to the first surface of the base;
a plurality of chip pattern regions formed on the light shielding pattern;
scribe regions defined between the chip pattern regions, the scribe regions being defined by using the light shielding pattern; and
slits formed into and through the light shielding pattern and to the first surface of the base to define electrically-isolated chip pattern region areas, the slits surrounding the electrically-isolated chip pattern region areas to electrically isolate the electrically-isolated chip pattern region areas from either a remaining portion of the light shielding pattern disposed outside of the electrically-isolated chip pattern region areas or adjacent ones of other electrically-isolated chip pattern region areas.

2. The photomask according to claim 1, where the slits are defined in portions adjacent to the scribe regions in the chip pattern regions.

3. The photomask according to claim 1, wherein the slits are defined in the scribe regions.

4. The photomask according to claim 3, wherein the slits are defined in portions adjacent to the chip pattern regions in the scribe regions.

5. The photomask according to claim 1, wherein the light shielding pattern is defined on substantially an entire surface of the base, and island-shaped isolated light shielding patterns are defined so as to be separated in island shapes from the light shielding pattern.

6. The photomask according to claim 5, wherein the island-shaped isolated light shielding patterns are defined in part of the scribe regions.

7. The photomask according to claim 1, wherein each of the chip pattern regions has a light shielding pattern for fabricating a semiconductor device.

\* \* \* \* \*